(12) United States Patent
Takeuchi et al.

(10) Patent No.: US 8,956,732 B2
(45) Date of Patent: Feb. 17, 2015

(54) POLYAMIDEIMIDE RESIN, ADHESIVE AGENT, MATERIAL FOR FLEXIBLE SUBSTRATE, FLEXIBLE LAMINATE, AND FLEXIBLE PRINT WIRING BOARD

(75) Inventors: Masaki Takeuchi, Chikusei (JP);
Katsuyuki Masuda, Chikusei (JP);
Kenichi Tomioka, Chikusei (JP);
Takako Ejiri, Chikusei (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 1017 days.

(21) Appl. No.: 12/444,234

(22) PCT Filed: Aug. 20, 2007

(86) PCT No.: PCT/JP2007/066100
§ 371 (c)(1),
(2), (4) Date: Mar. 12, 2010

(87) PCT Pub. No.: WO2008/041426
PCT Pub. Date: Apr. 10, 2008

(65) Prior Publication Data
US 2010/0170701 A1 Jul. 8, 2010

(30) Foreign Application Priority Data

Oct. 4, 2006 (JP) ................ P2006-273005
Mar. 8, 2007 (JP) ................ P2007-059093

(51) Int. Cl.
*B32B 27/00* (2006.01)
*C08G 18/50* (2006.01)
*C08G 18/61* (2006.01)
(Continued)

(52) U.S. Cl.
CPC . *B32B 7/12* (2013.01); *B32B 15/08* (2013.01);
*C08G 18/5036* (2013.01); *C08G 18/5057*
(2013.01); *C08G 18/615* (2013.01); *C08G
73/14* (2013.01); *C09J 179/08* (2013.01); *H05K
3/386* (2013.01); *H05K 1/0346* (2013.01);
(Continued)

(58) Field of Classification Search
CPC ... B32B 27/38; C08G 73/14; C08J 2400/105;
C08J 2400/108; C08L 101/025; C08L 101/08;
C08L 63/00; C09D 201/025; C09D 201/08;
C09J 179/025; C09J 179/08; C09J 201/025;
C09J 201/08
USPC ............ 428/414, 416, 473.5, 901; 525/419,
525/449, 452, 528, 533; 528/26, 38, 65
See application file for complete search history.

(56) References Cited

U.S. PATENT DOCUMENTS 5,212,279 A    5/1993   Nomura et al.
7,320,830 B2 * 1/2008   Itou et al. ............ 428/473.5
(Continued)

FOREIGN PATENT DOCUMENTS

CN    1582318     2/2005
EP    1 627 901   2/2006
(Continued)

OTHER PUBLICATIONS

Technical Bulletin Jeffamine® D-2000 Polyetheramine Hunstman. Accessed Dec. 14, 2011.*
(Continued)

*Primary Examiner* — Callie Shosho
*Assistant Examiner* — John Freeman
(74) *Attorney, Agent, or Firm* — Antonelli, Terry, Stout & Kraus, LLP.

(57) ABSTRACT

A polyamide-imide resin obtained by a process comprising the step of reacting an aromatic diisocyanate with a diimide dicarboxylic acid containing 40 mol % or more of a compound represented by the following general formula (1) and 20 mol % or more of a compound represented by the following general formula (2).

[Formula 1]

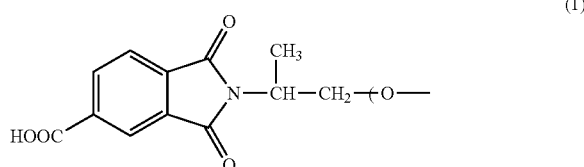

(1)

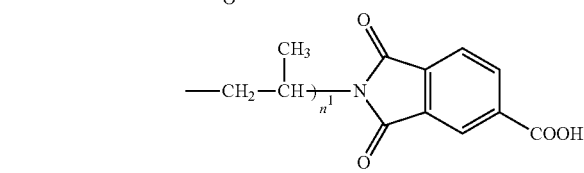

(2)

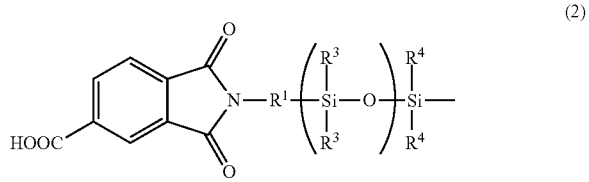

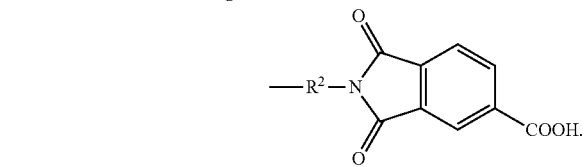

14 Claims, 7 Drawing Sheets

(51) Int. Cl.
  *B32B 7/12* (2006.01)
  *B32B 15/08* (2006.01)
  *C08G 73/14* (2006.01)
  *C09J 179/08* (2006.01)
  *H05K 3/38* (2006.01)
  *H05K 1/03* (2006.01)

(52) U.S. Cl.
  CPC ...... *H05K1/0393* (2013.01); *H05K 2201/0154* (2013.01); *Y10S 428/901* (2013.01)
  USPC ........ 428/473.5; 428/414; 428/416; 428/901; 525/419; 525/449; 525/452; 525/528; 525/533; 528/26; 528/38; 528/65

(56) References Cited

U.S. PATENT DOCUMENTS

| | | | |
|---|---|---|---|
| 2002/0012780 A1 * | 1/2002 | Yuyama et al. | 428/216 |
| 2005/0054776 A1 * | 3/2005 | Itou et al. | 525/191 |
| 2005/0106370 A1 * | 5/2005 | Takai et al. | 428/209 |

FOREIGN PATENT DOCUMENTS

| | | |
|---|---|---|
| JP | 3-104185 | 5/1991 |
| JP | 10-246958 | 9/1998 |
| JP | 11-106664 | 4/1999 |
| JP | 11-217503 | 8/1999 |
| JP | 2000-239340 | 9/2000 |
| JP | 3447070 | 7/2003 |
| JP | 2003327906 A * | 11/2003 |
| JP | 2004-091734 | 3/2004 |
| JP | 2004-179237 | 6/2004 |
| JP | 2004-230670 | 8/2004 |
| JP | 2006-86217 | 3/2006 |
| WO | WO 2005007756 A1 * | 1/2005 ............... C09D 5/00 |

OTHER PUBLICATIONS

Machine translation of JP 2003-327906 (2011).*
Translation of the International Preliminary Report on Patentability dated May 14, 2009, in Application No. PCT/JP2007/066100.
International Search Report dated Sep. 4, 2007, for Application No. PCT/JP2007/066100.
Extended European Search Report dated Aug. 1, 2012, including Supplementary European Search Report and European Search Opinion, for EP Application No. 07792714.3-2124/2070961 (PCT/JP2007/066100).

* cited by examiner

POLYAMIDEIMIDE RESIN, ADHESIVE AGENT, MATERIAL FOR FLEXIBLE SUBSTRATE, FLEXIBLE LAMINATE, AND FLEXIBLE PRINT WIRING BOARD

TECHNICAL FIELD

The present invention relates to polyamide-imide resins, adhesives, flexible board materials, flexible laminates, and flexible printed wiring boards.

BACKGROUND ART

A flexible printed wiring board is a flexible wiring board with a conductive circuit formed on the surface of a polymer insulating film, and has been frequently used as means to achieve the downsizing and densification of recent electronic equipment. Among others, the flexible printed wiring board provided with metal foils on both sides thereof has been in a highly growing demand.

The aromatic polyimide film is generally used as the polymer insulating film. The flexible printed wiring board provided with metal foils on both sides thereof using such a film has been produced by a method wherein metal foil-polyimide films each with a metal foil laminated on one side thereof are adhered with each other using an adhesive containing an epoxy resin, acrylic resin, or the like, as a major component. For this reason, properties of the printed wiring board such as heat resistance, chemical resistance, fire retardancy, electrical properties, and adhesion are affected by the adhesive used, and such excellent properties distinctive of polyimide were not fully utilized.

On the other hand, a method is proposed wherein, using a thermoplastic polyimide film as an adhesive, metal foil-laminated polyimide films are thermally fused through the thermoplastic polyimide film (e.g., see Patent Documents 1 and 2). Alternatively, a method is known wherein metal layers are formed directly on both sides of a polyimide film by vapor deposition or sputtering (e.g., see Patent Document 3).

However, the flexible printed wiring board that uses a thermoplastic polyimide as an adhesive did not have satisfactory resistance to thermal history because the heat resistance of the thermal plastic polyimide was not always sufficient. Further, due to the high molding temperature for the thermal fusion, there was a problem in that an intricate manufacturing facility was required. As for the manufacturing method employing sputtering, there were problems in that a special apparatus for performing sputtering was required as well as a plating step and warm-heat treatment were sometimes involved, whereby the manufacturing process became complicated.

Consequently, polyamide-imide resin type thermosetting adhesives are considered which combine a heat resistant resin such as a polyamide-imide resin and a thermosetting resin and cure by the reaction of these resins (e.g., see Patent Documents 4 and 5).

Patent Document 1: Japanese Patent Laid-Open No. 03-104185
Patent Document 2: Japanese Patent Laid-Open No. 2004-230670
Patent Document 3: Japanese Patent No. 3447070
Patent Document 4: Japanese Patent Laid-Open No. 11-217503
Patent Document 5: Japanese Patent Laid-Open No. 2004-179237

DISCLOSURE OF THE INVENTION

However, the conventional polyamide-imide resin type adhesives had a drawback in that the adhesion force thereof to polyimide is seriously deteriorated when they absorb moisture.

Accordingly, an object of the present invention is, in the adhesives that employ a polyamide-imide resin, to inhibit deterioration of adhesion force to polyimide when moisture is absorbed while maintaining the outstanding heat resistance thereof.

The present inventors conducted extensive studies and found that a reduction in adhesion at moisture absorption can be inhibited by using a polyamide-imide resin having a specific structure and combining it with an epoxy resin, whereby the present invention has been accomplished.

More specifically, the polyamide-imide resin according to the present invention is obtained by a process comprising the step of reacting a diimide dicarboxylic acid with an aromatic diisocyanate, wherein the diimide dicarboxylic acid contains 40 mol % or more of a compound represented by the following general formula (1) and 20 mol % or more of a compound represented by the following general formula (2).

[Formula 1]

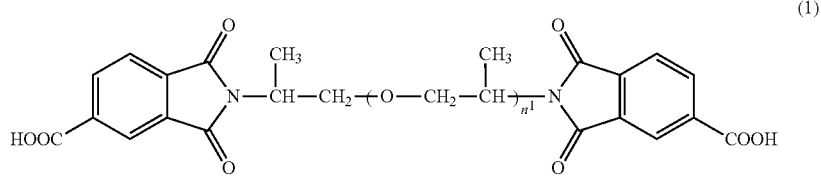

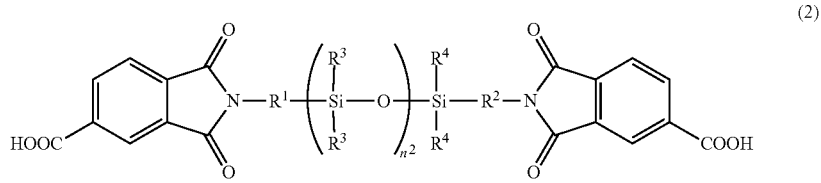

In the formula (1), $n^1$ is an integer of 1 to 100 and in the formula (2), $R^1$ and $R^2$ each independently represent a divalent organic group, $R^3$ and $R^4$ each independently represent a $C_{1-20}$ alkyl group or a $C_{6-18}$ aryl group, a plurality of $R^3$ and $R^4$ in the same molecule may be the same or different, and $n^2$ is an integer of 1 to 50.

The polyamide-imide resin according to the present invention described above, when used as an adhesive in combination with an epoxy resin, can sufficiently inhibit a reduction of adhesion force to polyimide at a moisture absorbed condition while good heat resistance is maintained.

The polyamide-imide resin of the present invention preferably has at least one terminal functional group selected from the group consisting of a carboxyl group, an amino group, an acid anhydride group, and a mercapto group. As a result, the heat resistance of the adhesive can further be enhanced.

EFFECT OF THE INVENTION

According to the present invention, a polyamide-imide resin type adhesive having inhibited reduction of adhesion to polyimide at a moisture absorbed condition while maintaining good heat resistance is provided. Moreover, it is possible to perform processes, such as adhesion, using a simpler facility as compared with the case where a thermoplastic polyimide is used as an adhesive and the case where a metal foil is formed directly on a polyimide film by sputtering.

Figure 1:
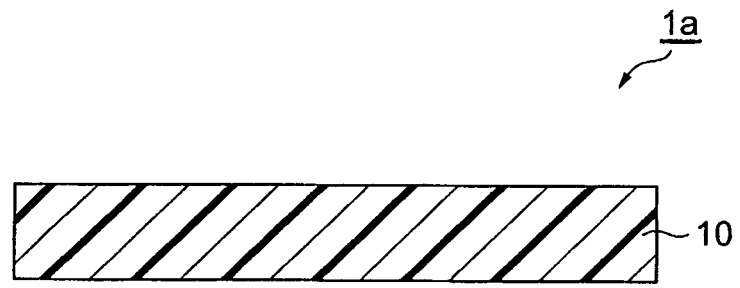
FIG. 1 is a sectional view showing an embodiment of an adhesion sheet.

DESCRIPTION OF SYMBOLS $1a$ . . . . Adhesion sheet, $1b$ . . . . Cover lay, $2a$, $2b$ . . . . Flexible laminate, $3a$, $3b$, $3c$ . . . . Flexible printed wiring board, $5$ . . . . Resin film provided with a metal foil, $10$ . . . . Adhesive layer, $20$ . . . . Resin film, $21$ . . . . Polyimide film, $22$ . . . . Resin film, $30$ . . . . Metal foil, $31$ . . . . Metal foil forming wiring patter.

BEST MODES FOR CARRYING OUT THE INVENTION

Preferred embodiments of the present invention will be described below in detail. However, the present invention is not limited to the following embodiments.

The polyamide-imide resin according to the present embodiment is obtained by a process comprising the steps of producing a diimide dicarboxylic acid by the reaction of a diamine and a trimellitic anhydride, and producing a polyamide-imide resin by a reaction of a diimide dicarboxylic acid and an aromatic diisocyanate. A polyamide-imide resin, which is a polymer having an amide group and an imide group in the main chain, is produced by the polymerization reaction between a diimide dicarboxylic acid and an aromatic diisocyanate. The polyamide-imide resin according to the present embodiment can be suitably obtained by the process described above, but the process is not limited to the above process unless it deviates from the spirit of the present invention. For example, the polyamide-imide resin according to the present invention may be those obtained by the acid chloride method wherein a trimellitic anhydride is reacted with a diamine.

The diamine used for producing the diimide dicarboxylic acid contains at least a polyoxy propylenediamine represented by the following general formula (10) and a siloxane diamine represented by the following general formula (20). As a result, the diimide dicarboxylic acids each represented by the earlier formulae (1) and (2) are produced.

[Formula 2]

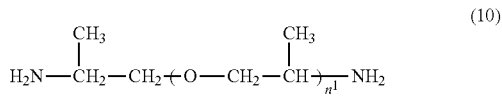
(10)

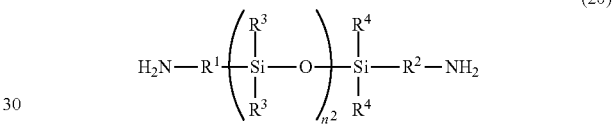
(20)

Preferably, a diamine mixture containing the above polyoxy propylenediamine and a siloxane diamine in 5 to 100 mol %, respectively, is reacted with a trimellitic anhydride. More preferably, a diamine mixture containing 40 mol % or more of the polyoxy propylenediamine and 20 mol % or more of the siloxane diamine is reacted with a trimellitic anhydride. Accordingly, obtained is a diimide dicarboxylic acid mixture containing 40 mol % or more of the compound represented by the formula (1) and 20 mol % or more of the compound represented by the formula (2). Consequently, the adhesiveness having particularly outstanding balance among adhesion, moisture resistance, and heat resistance is obtained. When a ratio of the polyoxy propylenediamine is below 40 mol %, adhesiveness and moisture resistance tend to be likely to reduce. When a ratio of the siloxane diamine is below 20 mol %, adhesiveness and moisture resistance also tend to be likely to reduce.

In place of using the diamine mixture as described above, a polyoxy propylenediamine and a siloxane diamine may be each separately reacted with a trimellitic anhydride to produce diimide dicarboxylic acids and each diimide dicarboxylic acid obtained be mixed in the determined ratio for the reaction with aromatic diisocyanate.

Examples of polyoxy propylenediamine are commercially available Jeffamine D-230 (Mitsui Fine Chemicals, Inc., amine equivalent: 115, tradename), Jeffamine D-400 (Mitsui Fine Chemicals, Inc., tradename, amine equivalent: 200), Jeffamine D-2000 (Mitsui Fine Chemicals, Inc., tradename, amine equivalent: 1000) and Jeffamine D-4000 (Mitsui Fine Chemicals, Inc., tradename, amine equivalent: 2000). Among these, it is preferred to use Jeffamine D2000 having a large amine equivalent. The amine equivalent of polyoxy propylenediamine is preferably 500 to 1500 g/eq. These are used singly, or two or more are used in combination.

In the siloxane diamine of the formula (20), $R^1$ and $R^2$ each independently represent a divalent organic group, and $R^3$ and $R^4$ each independently represent a $C_{1-20}$ alkyl group or a $C_{6-18}$ aryl group. $R^1$ and $R^2$ are preferably a $C_{1-6}$ alkylene group, an optionally substituted (preferably with a $C_{1-3}$ alkyl group or a halogen atom) phenylene group, or an optionally substituted (preferably with a $C_{1-3}$ alkyl group or a halogen atom) naphthalene group. $R^3$ and $R^4$ are preferably an optionally substituted (preferably with a $C_{1-3}$ alkyl group or a halogen atom) phenyl group or a $C_{1-3}$ alkyl group.

Examples of commercially available siloxane diamine are amino-modified silicone oils such as X-22-161AS (amine equivalent 450), X-22-161A (amine equivalent 840), X-22-161B (amine equivalent 1500) (all from Shin-Etsu Chemical Co., Ltd.), BY16-853 (amine equivalent 650), BY-16-853B (amine equivalent 2200) (all from Toray Dow Corning Silicone Co., Ltd.), X-22-9409 (amine equivalent 680) and X-22-1660B (amine equivalent 2260, all from Shin-Etsu Chemical Co., Ltd.). These products are used singly, or two or more are used in combination.

Further, alicyclic diamine and/or aromatic diamine can be used if necessary together with the diamine described above. Examples of alicyclic diamine include 2,2-bis[4-(4-aminocyclohexyloxy)cyclohexyl]propane, bis[4-(3-aminocyclohexyloxy)cyclohexyl]sulfone, bis[4-(4-aminocyclohexyloxy)cyclohexyl]sulfone, 2,2-bis[4-(4-aminocyclohexyloxy)cyclohexyl]hexafluoropropane, bis[4-(4-aminocyclohexyloxy)cyclohexyl]methane, 4,4'-bis(4-aminocyclohexyloxy)dicyclohexyl, bis[4-(4-aminocyclohexyloxy)cyclohexyl]ether, bis[4-(4-aminocyclohexyloxy)cyclohexyl]ketone, 1,3-bis(4-aminocyclohexyloxy)benzene, 1,4-bis(4-aminocyclohexyloxy)benzene, 2,2'-dimethylbicyclohexyl-4,4'-diamine, 2,2'-bis(trifluoromethyl)dicyclohexyl-4,4'-diamine, 2,6,2',6'-tetramethyldicyclohexyl-4,4'-diamine, 5,5'-dimethyl-2,2'-sulfonyl-dicyclohexyl-4,4'-diamine, 3,3'-dihydroxydicyclohexyl-4,4'-diamine, (4,4'-diamino)dicyclohexylether, (4,4'-diamino)dicyclohexylsulfone, (4,4'-diaminocyclohexyl)ketone, (3,3'-diamino)benzophenone, (4,4'-diamino)dicyclohexylmethane, (3,3'-diamino)dicyclohexylether, (3,3'-diamino)dicyclohexylether and 2,2-bis(4-aminocyclohexyl)propane. These can be used singly or in combination.

Among these, particularly preferable is at least one alicyclic diamine selected from the group consisting of 2,2-bis[4-(4-aminocyclohexyloxy)cyclohexyl]propane, bis[4-(3-aminocyclohexyloxy)cyclohexyl]sulfone, bis[4-(4-aminocyclohexyloxy)cyclohexyl]sulfone, 2,2-bis[4-(4-aminocyclohexyloxy)cyclohexyl]hexafluoropropane, bis[4-(4-aminocyclohexyloxy)cyclohexyl]methane, 4,4'-bis(4-aminocyclohexyloxy)dicyclohexyl, bis[4-(4-aminocyclohexyloxy)cyclohexyl]ether and bis[4-(4-aminocyclohexyloxy)cyclohexyl]ketone.

Specific examples of aromatic diamine include p-, m- or o-phenylenediamine, 2,4-diaminotoluene, 2,5-diaminotoluene, 2,4-diaminoxylene, diamino diurene, 1,5-diaminonaphthalene, 2,6-diaminonaphthalene, benzidine, 4,4'-diaminoterphenyl, 4,4'-diaminoquaterphenyl, 4,4'-diaminodiphenylmethane, 1,2-bis(anilino)ethane, 4,4'-diamino diphenyl ether, diaminodiphenylsulfone, 2,2-bis(p-aminophenyl)propane, 2,2-bis(p-aminophenyl)hexafluoropropane, 3,3-dimethylbenzidine, 3,3'-dimethyl-4,4'-diamino diphenyl ether, 3,3'-dimethyl-4,4'-diaminodiphenyl methane, diaminotoluene, diamino benzotrifluoride, 1,4-bis(p-aminophenoxy)benzene, 4,4'-bis(p-aminophenoxy)biphenyl, 2,2'-bis[4-(p-aminophenoxy)phenyl]propane, diaminoanthraquinone, 4,4'-bis(3-aminophenoxyphenyl)diphenylsulfone, 1,3-bis(anilino)hexafluoropropane, 1,4-bis(anilino)octafluorobutane, 1,5-bis(anilino)decafluoropentane, 1,7-bis(anilino)decafluorobutane, 2,2-bis[4-(p-aminophenoxy)phenyl]hexafluoropropane, 2,2-bis[4-(3-aminophenoxy)phenyl]hexafluoropropane, 2,2-bis[4-(2-aminophenoxy)phenyl]hexafluoropropane, 2,2-bis[4-(4-aminophenoxy)-3,5-dimethylphenyl]hexafluoropropane, 2,2-bis[4-(4-aminophenoxy)-3,5-ditrifluoromethylphenyl]hexafluoropropane, p-bis(4-amino-2-trifluoromethylphenoxy)benzene, 4,4'-bis(4-amino-2-trifluoromethylphenoxy)biphenyl, 4,4'-bis(4-amino-3-trifluoromethylphenoxy)biphenyl, 4,4'-bis(4-amino-2-trifluoromethylphenoxy)diphenylsulfone, 4,4'-bis(3-amino-5-trifluoromethylphenoxy)diphenylsulfone and 2,2-bis[4-(4-amino-3-trifluoromethylphenoxy)phenyl)]hexafluoropropane.

The diimide dicarboxylic acid mixture to be reacted with the aromatic diisocyanate contains 40 to 80 mol % of the diimide dicarboxylic acid of the formula (1) and 20 to 60 mol % of the diimide dicarboxylic acid of the formula (2). Consequently, the polyamide-imide resin containing a polyoxy propylene chain and a polysiloxane chain is produced.

The aromatic diisocyanate to be reacted with the diimide dicarboxylic acid is a diisocyanate having an isocyanate group bonded to an aromatic ring, and can be obtained by, for example, a reaction between aromatic diamine and phosgene. Specific examples of the aromatic diisocyanate include tolylene diisocyanate, 4,4'-diphenylmethane diisocyanate, naphthalene diisocyanate, diphenylether diisocyanate and phenylene-1,3-diisocyanate. These are used singly, or two or more are used in combination.

The polymerization reaction between the diimide carboxylic acid and aromatic diisocyanate is typically carried out in a solvent selected from N-methyl-2-pyrrolidone (NMP), N,N-dimethylformamide (DMF), N,N-dimethylacetamide (DMAC), dimethylsulfoxide (DMSO), dimethyl sulfate, sulfolane, γ-butyrolactone, cresol, phenol, halogenated phenol, cyclohexane, and dioxane. The reaction temperature is preferably 0 to 200° C. After reaction, the polyamide-imide resin is produced in the state of solution. Without isolating the polyamide-imide resin from the solution, the solution can be used as is for the preparation of an adhesive varnish.

The polyamide-imide resin formed by the polymerization reaction between the diimide dicarboxylic acid and the aromatic diisocyanate is preferably subjected to the step of introducing to the terminal a reactive functional group reactive with an epoxy resin in the light of further heat resistance improvement, etc. The reactive functional group is preferably selected from the group consisting of a carboxyl group, an amino group, an acid anhydride group, and a mercapto group. An amino group may be introduced as imidazole. Among these, a carboxyl group and an amino group are preferred, with a carboxyl group being most preferred.

The reactive functional group is introduced by, for example, a method wherein a compound having one or two or more reactive functional groups is reacted with the terminal functional group of the polyamide-imide resin (typically isocyanate group). Preferably, the polyamide-imide resin has a reactive functional group introduced to the terminal by the reaction with a compound selected from the group consisting of phthalic acid, trimellitic acid, maleic acid, biphthalic acid, naphthalene dicarboxylic acid, aminonaphthalene acid, aminobenzoic acid, diaminonaphthalene, diaminobenzoic acid, phenyldiamine and derivatives thereof.

When a carboxyl group is introduced to the polyamide-imide resin, the carboxylic acid equivalent of the polyamideimide resin is preferably 3000 to 15000 g/eq., and more preferably 5000 to 10000 g/eq. When a carboxylic acid equivalent exceeds 15000 g/eq., the heat resistance improvement effect by the terminal modification tends to be small, whereas when a carboxylic acid equivalent is less than 3000 g/eq., unreacted residues tend to be likely to occur in the system.

When an amino group is introduced to the polyamide-imide resin, the amine equivalent of the polyamide-imide resin is preferably 3000 to 15000 g/eq., and more preferably 5000 to 10000 g/eq. When an amine equivalent exceeds 15000 g/eq., the heat resistance improvement effect by the terminal modification tends to be small, whereas when an amine equivalent is less than 3000 g/eq., unreacted residues tend to be likely to occur in the system.

The adhesive according to the present embodiment contains the polyamide-imide resin as described above and an epoxy resin. The adhesive according to the present embodiment is particularly suitable to use as an adhesive for polyimide, which is for adhering an adhered such as a polyimide film composed of polyimide, or the like, to other members.

As the epoxy resin, polyfunctional epoxy compounds having two or more epoxy groups are preferred. Examples of the polyfunctional epoxy compounds include polyglycidyl ether obtained by reacting epichlorohydrin with polyhydric phenols such as bisphenol A, novolac type phenol resins, orthocresol novolac type phenol resins, etc., or polyhydric alcohols such as 1,4-butanediol, etc., polyglycidyl ester obtained by reacting polybasic acids such as phthalic acid, hexahydrophthalic acid, etc., with epichlorohydrin, N-glycidyl derivatives of compounds having amine, amide or heterocyclic nitrogen base, and alicyclic epoxy resins. Among these, alicyclic epoxy resins such as dicyclopentadiene type epoxy resins, etc., are particularly preferred. The epoxy resin is used singly, or two or more are used in combination.

The epoxy resin content ranges typically from 10 to 50 parts by mass per 100 parts by mass of the polyamide-imide resin.

The adhesive according to the present embodiment may further contain a curing agent and/or curing accelerator for the epoxy resin. The curing agent and curing accelerator are not limited insofar as they react with and/or accelerate the curing of the epoxy resin, and usable examples include amines, imidazoles, polyfunctional phenols and acid anhydrides.

Usable amines are, for example, dicyandiamide, diaminodiphenylmethane, or guanylurea. Usable polyfunctional phenols are, for example, hydroquinone, resorcinol, bisphenol A and halogenated compounds thereof, and further condensation products with formaldehyde such as novolac type phenol resins and resol type phenol resins. Usable acid anhydrides are, for example, phthalic anhydride, benzophenone tetracarboxylic dianhydride, and methyl himic acid. Further, as the curing accelerator, imidazoles such as alkyl group substituted imidazole, benzimidazole, etc., can be used.

The adhesive containing the polyamide-imide resin, epoxy resin and other arbitrary components is suitably used in the state of adhesive varnish dissolved or dispersed in a solvent when applied to adherends such as a polyimide film, etc., or other substrates, etc. The solvent used for the varnish is selected from, for example, N-methyl-2-pyrrolidone (NMP), N,N-dimethylformamide (DMF), N,N-dimethylacetamide (DMAC), dimethylsulfoxide (DMSO), dimethyl sulfate, sulfolane, γ-butyrolactone, cresol, phenol, halogenated phenol, cyclohexane and dioxane. Preferably, the solvent used for the synthesis of the polyamide-imide resin can be used as the solvent for the adhesive varnish.

When the adhesive layer composed of the adhesive according to the present embodiment is formed on a polyimide film, the adhesive has an adhesion force of 1.0 kN/m or more at ordinary state at the interface between the polyimide film and the adhesive layer, maintains an adhesion force of, after a 3 hour PCT test, 90% or higher of a pre-test value, and has a solder heat resistance of 30 seconds or longer when measured by the float process using a soldering bath at 288° C. Thus, the adhesive, when used as a polyimide adhesive, can enhance the connection reliability.

The adhesion and solder heat resistance described above are measured using a test sample prepared by applying the adhesive or adhesive varnish in a thickness of 10 μm to a polyimide film, adhering another polyimide film thereto with the adhesive interposed therebetween, and heat curing it. The above-mentioned adhesion is an average load when the polyimide film-adhesive interface is separated under the conditions of a peel angle of 90 degree and a peel rate of 50 mm/min. The adhesion after the PCT test is measured using a test sample that has been allowed to stand for 3 hours under atmosphere of 121° C., 2 atmospheric pressures and RH 100%. According to the adhesive of the present embodiment, the adhesion force after the PCT test measured under these conditions does not reduce more than 10% of the pre-PCT test, i.e., adhesion force at an ordinary state.

Using the adhesive according to the present embodiment, a flexible board material, a flexible laminate, or a flexible printed wiring board, provided with an adhesive layer composed of such an adhesive is constructed.

Figure 2:
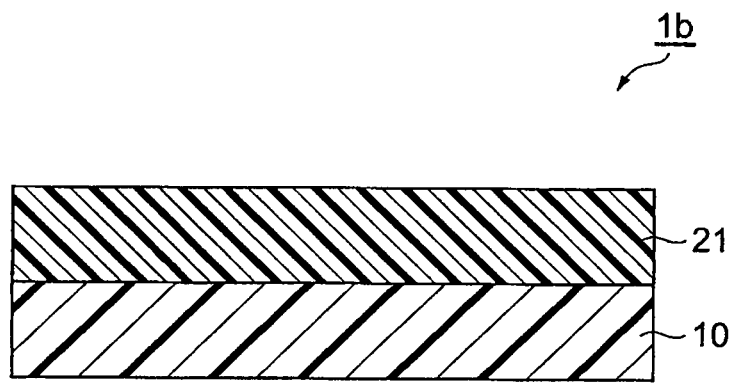
FIG. 2 is a sectional view showing an embodiment of a cover lay.

Examples of the flexible board material include the adhesion sheet shown in FIG. 1 and the cover lay shown in FIG. 2. The adhesion sheet 1a of FIG. 1 has an adhesive layer 10 formed of the adhesive according to the present embodiment. The cover lay 1b of FIG. 2 has a polyimide film 21 and an adhesive layer 10 provided on the polyimide film 21 which is formed of the adhesive according to the present embodiment. The adhesive forming these adhesive layers 10 is typically in the form of film from which the solvent has substantially been removed. The thickness of the polyimide film 21 is about 1 to about 100 μm. The thickness of the adhesive layer is typically about 0.5 to about 50 μm.

The polyimide film 21 can be a commercially available product. Examples of the commercially available polyimide film include Upirex (Ube Industries, Ltd., tradename), Kapton (Toray-DuPont Co., Ltd., tradename), and Apical (Kaneka Corporation, tradename).

Figure 3:
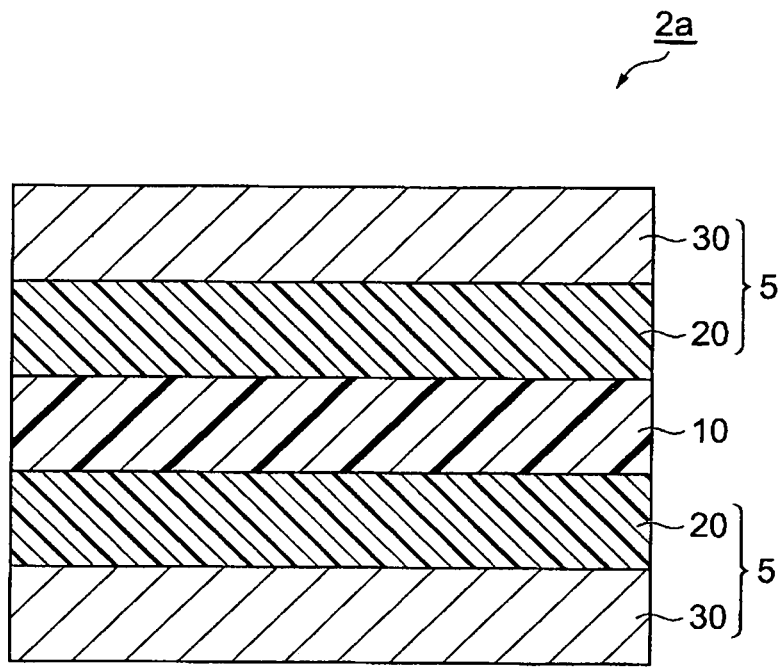
FIG. 3 is a sectional view showing an embodiment of a flexible laminate.
Figure 4:
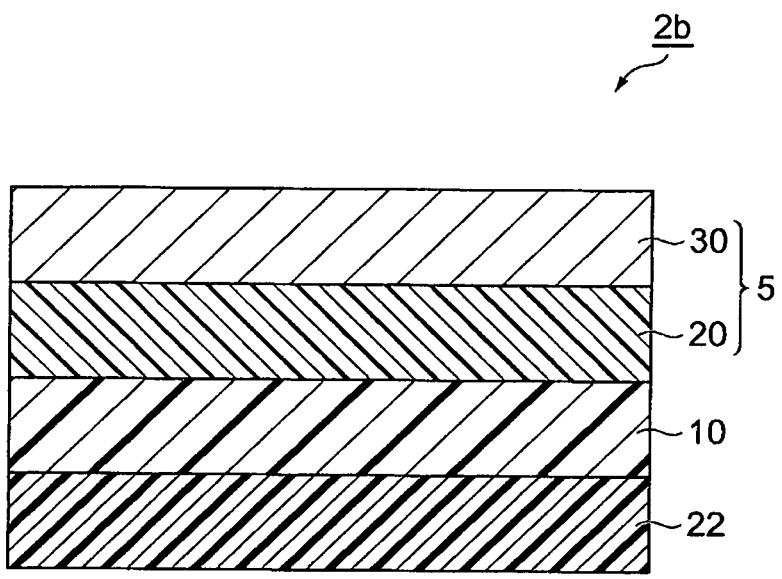
FIG. 4 is a sectional view showing an embodiment of a flexible laminate.

FIGS. 3 and 4 are sectional views showing an embodiment of a flexible laminate. The flexible laminate 2a shown in FIG. 3 comprises a resin film 20 and a metal foil 30 tightly attached on one surface of the resin film 20, and provided with two metal foil-laminated resin films 5 oppositely arranged to each other with the resin film 20 facing inward and an adhesive layer 10 interposed between the two metal foil-laminated resin films 5 adhering these films. The flexible laminate 2b shown in FIG. 4 is provided with a metal foil-laminated resin film 5 having a resin film 20 and a metal foil 30 tightly attached on one surface of the resin film 20, a resin film 22 oppositely disposed to the metal foil-laminated resin film 5 at the resin film 20 side, and an adhesive layer 10 interposed between the metal foil-laminated resin film 5 and the resin film 22 to adhere these films.

As the metal foil 30, suitably used are a foil of copper, aluminum, iron, gold, silver, nickel, palladium, chromium, molybdenum or an alloy thereof. A copper foil is preferable among these. To enhance the adhesion force to the resin film 20, the surface of the metal foil 30 may be mechanically or chemically treated by chemical roughening, corona discharge, sanding, plating, aluminium alcoholate, aluminum chelate, silane coupling agent, or the like.

The flexible laminate is obtained by a method wherein, for example, a metal foil-laminated resin film is adhered to another metal foil-laminated resin film or resin film through an adhesive layer. The adhering methods are heat pressing and heat lamination. In either method, the heating must be carried out at a temperature ranging from 80 to 300° C., and preferably from 120 to 200° C. A temperature below 80° C. makes it difficult to adhere the films with sufficient adhesion force, whereas a temperature exceeding 300° C. may involve the thermal decomposition of the polyamide-imide resin in the adhesive layer.

For the heat lamination, effective adhering can be attained by preheating the part to be adhered to 80 to 300° C., further maintaining a thermocompression roll and the part to be adhered at 80 to 300° C. Further, it is preferred to apply pressure together with heating. It is desirable for the heat pressing to apply pressure of 0.1 MPa or more, preferably 2 MPa or more and 5 MPa or less, and for the heat lamination to apply pressure of 10 kN/m or more, preferably 50 kN/m or more and 200 kN/m or less.

Figure 5:
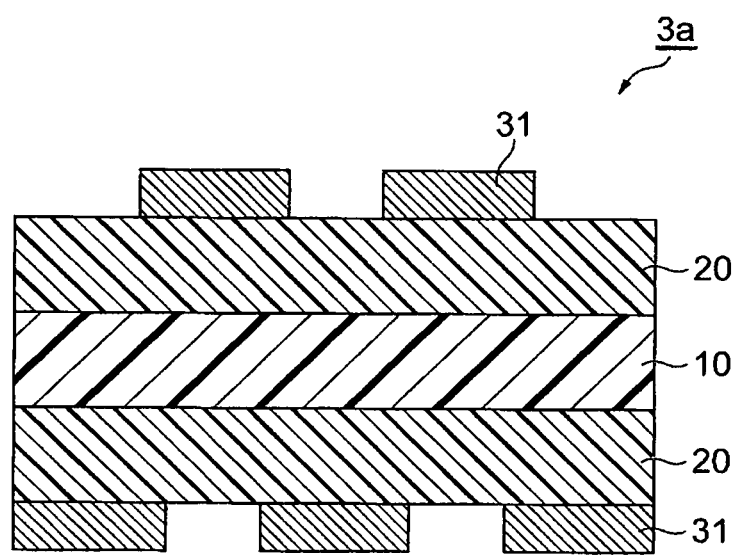
FIG. 5 is a sectional view showing an embodiment of a flexible printed wiring board.
Figure 6:
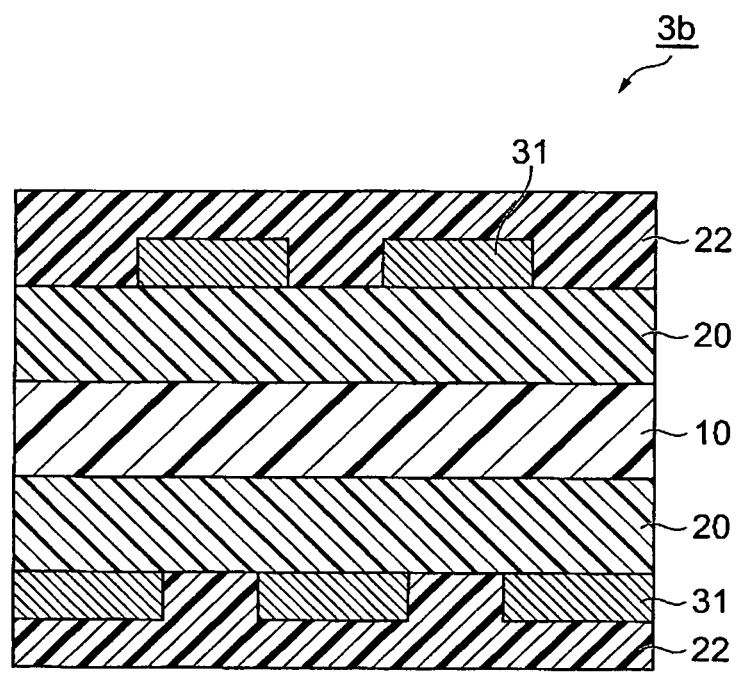
FIG. 6 is a sectional view showing an embodiment of a flexible printed wiring board.
Figure 7:
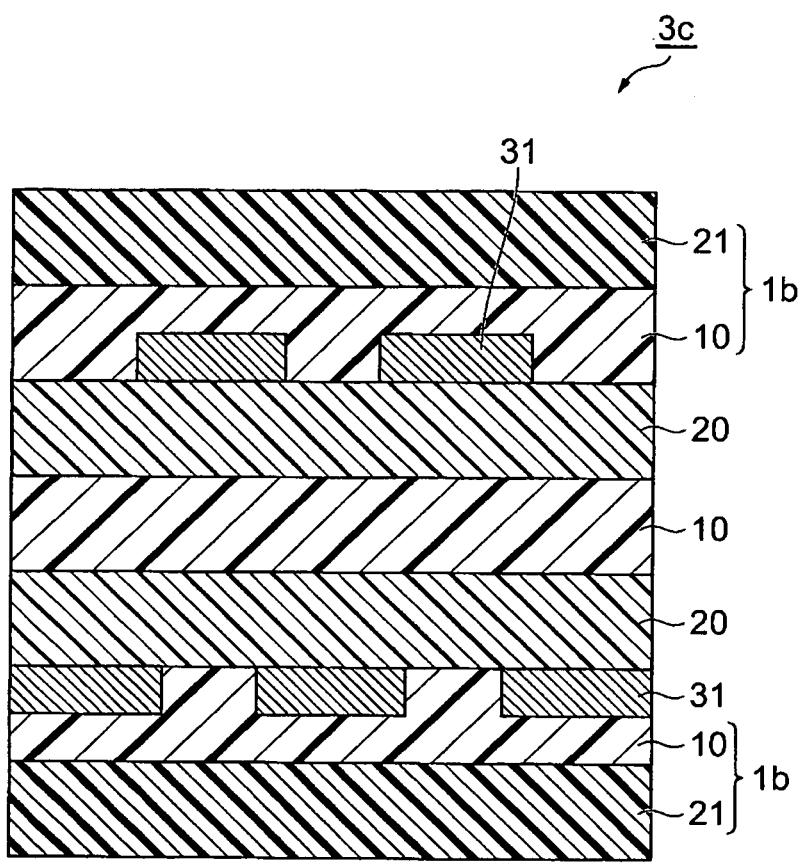
FIG. 7 is a sectional view showing an embodiment of a flexible printed wiring board.

FIGS. 5, 6 and 7 are sectional views showing an embodiment of the flexible printed wiring board. The flexible printed wiring board 3a shown in FIG. 5 is provided with an insulating layer composed of two resin films 20 oppositely arranged to each other and an adhesive layer 10 interposed therebetween and metal foils 31 disposed on both sides of the insulating layer and forming wiring patterns (electrically conductive pattern).

The metal foil 31 is formed by, for example, removing a part of the metal foil 30 constituting the flexible laminate 2a and patterning the foil. The patterning of the metal foil 30 is carried out by photolithography, or like method. Alternatively, the flexible printed wiring board can be obtained by removing the metal foils 30 from the flexible laminate 2a, directly drawing conductive material on the exposed resin film 20 to form an electrically conductive pattern.

The flexible printed wiring board 3b shown in FIG. 6 is provided with an insulating layer composed of two resin films 20 oppositely arranged to each other and an adhesive layer 10 interposed therebetween and metal foils 31 disposed on both sides of the insulating layer and forming a wiring pattern (electrically conductive pattern), a resin film 22 laminated on each of the metal foils 31. The flexible printed wiring board 3b can be obtained by a method wherein, for example, a resin film 22 is adhered to each of the meal foils 31 forming the wiring pattern of the flexible printed wiring board 3a.

The flexible printed wiring board 3c shown in FIG. 7 is provided with an insulating layer composed of two resin films 20 oppositely arranged to each other and an adhesive layer 10 interposed therebetween, metal foils 31 disposed on both sides of the insulating layer and forming a wiring pattern (electrically conductive pattern), and a cover lay 1b having a polyimide film 21 and an adhesive layer 10 disposed on the polyimide film 21 which is positioned on each of the metal foil 31 in the direction positioned at the metal foils 31 side. The adhesive layer 10 in the insulating layer adheres the two resin films 20 with each other. The adhesive layer 10 in the cover lay 1b adheres the polyimide film 21 to the resin film 20 or the metal foils 31 forming a wiring pattern. The flexible printed wiring board 3c is obtained, for example, using the cover lay 1b of FIG. 2 in place of the resin film 20 used in the manufacture of a flexible printed wiring board.

The adhesive layers 10 composing the above flexible laminate and flexible printed wiring board are both formed of the adhesive according to the embodiments described above, and at least a part of the polyamide-imide resin contained in the adhesive layers 10 is crosslinked by the reaction with the epoxy resin. The polyimide film is typically used as the resin films 20 and 22.

Example 1

Hereinafter, the present invention is described in detail with reference to Examples. However, the present invention is not limited to these Examples.

1. Synthesis of Polyamide-Imide Resin

A polyamide-imide resin was synthesized using the following diamines.

"Jeffamine D-2000" (Mitsui Fine Chemicals, Inc., tradename): polyoxy propylenediamine "X-22-161A" (Shin-Etsu Chemical Co., Ltd., tradename): silicone diamine (diamine of the formula (20) wherein $R^1$ and $R^2$ are an ethylene group (—$(CH_2)_2$—), and $R^3$ and $R^4$ are a methyl group (—$CH_3$), and $n^2$ is about 20)

"Wondamine HM (WHM)" (New Japan Chemical Co., Ltd., tradename): (4,4'-diamino)dicyclohexylmethane "BAPP" (Wakayama Seika Co., Ltd., tradename): 2,2-bis [4-(p-aminophenoxy)phenyl]propane Synthesis Example 1

51.43 g (25.7 mmol, 50 mol %) of Jeffamine D-2000, 32.0 g (20.0 mmol, 35 mol %) of X-22-161A, 1.80 g (8.6 mmol, 15 mol %) of WHM, 23.05 g (120.0 mmol) trimellitic anhydride (hereinafter referred to as "TMA"), and 128 g of N-methyl-2-pyrrolidone (hereinafter referred to as "NMP") were charged into a 500 ml separable flask equipped with a thermocouple, a stirrer and a nitrogen inlet in a nitrogen stream at 250 ml/min and stirred to dissolve the ingredients in NMP, whereby a reaction mixture was prepared.

50 g of toluene was added to the reaction mixture to form diimide dicarboxylic acid by the ring closure reaction of imide ring caused by the dehydration reflux at a temperature of 150° C. or higher for 6 hours, and the toluene was then distilled off. After cooling, 17.16 g (68.3 mmol) of 4,4'-diphenylmethane diisocyanate (hereinafter referred to as "MDI") was added thereto, and an amidation reaction was allowed to proceed by heating at 150° C. for 2 hours, whereby a solution of polyamide-imide resin 1 was obtained.

Synthesis Example 2

A solution of polyamide-imide resin 2 was obtained in the same manner as in Synthesis Example 1, except that 57.20 g (28.6 mmol, 50 mol %) of Jeffamine D-2000, 22.88 g (14.3 mmol, 25 mol %) of X-22-161A, and 5.88 g (14.3 mmol, 25 mol %) of BAPP were used as the diamines.

Synthesis Example 3

A solution of polyamide-imide resin 3 was obtained in the same manner as in Synthesis Example 1, except that 51.40 g (25.7 mmol, 45 mol %) of Jeffamine D-2000, 41.12 g (25.7 mmol, 45 mol %) of X-22-161A, and 1.20 g (5.71 mmol, 10 mol %) of WHM were used as the diamines.

Synthesis Example 4

A solution of polyamide-imide resin 4 was obtained in the same manner as in Synthesis Example 1, except that 68.4 g (34.2 mmol, 60 mol %) of Jeffamine D-2000, and 36.48 g (22.8 mmol, 40 mol %) of X-22-161A were used as the diamines.

Synthesis Example 5

A solution of polyamide-imide resin 5 was obtained in the same manner as in Synthesis Example 1, except that 39.9 g (20.0 mmol, 35 mol %) of Jeffamine D-2000, 36.48 g (22.8 mmol, 40 mol %) of X-22-161A, and 5.88 g (14.3 mmol, 25 mol %) of BAPP were used as the diamines.

Synthesis Example 6

A solution of polyamide-imide resin 6 was obtained in the same manner as in Synthesis Example 1, except that 22.88 g (14.3 mmol, 25 mol %) of X-22-161A, 9.44 g (22.9 mmol, 40 mol %) of BAPP, and 4.20 g (20.0 mmol, 35 mol %) of WHM were used as the diamines.

Synthesis Example 7

A solution of polyamide-imide resin 7 was obtained in the same manner as in Synthesis Example 1, except that 68.0 g (34.0 mmol, 60 mol %) of Jeffamine D-2000, 13.60 g (8.5 mmol, 15 mol %) of X-22-161A, and 5.85 g (14.17 mmol, 25 mol %) of BAPP were used as the diamines.

Synthesis Example 8

40.0 g (20.0 mmol, 45 mol %) of Jeffamine D-2000, 32.0 g (20.0 mmol, 45 mol %) of X-22-161A, 0.935 g (4.44 mmol, 10 mol %) of WHM, 17.9 g (93.2 mmol) of TMA, and 110 g of NMP were charged into a 500 ml separable flask equipped with a thermocouple, a stirrer and a nitrogen inlet in a nitrogen stream at 250 ml/min and stirred to dissolve the ingredients in NMP, whereby a reaction mixture was prepared.

100 g of toluene was added to the reaction mixture to form diimide dicarboxylic acid by the ring closure reaction of imide ring caused by the dehydration reflux at a temperature of 150° C. or higher for 6 hours, and the toluene was then distilled off. After cooling, 17.16 g (21.4 mmol) of MDI was added thereto, and an amidation reaction was allowed to proceed by heating at 150° C. for 2 hours, whereby an unmodified polyamide-imide resin was formed.

Subsequently, 5.0 g (26.0 mmol) of TMA was added to the reaction mixture and stirred with heating to 80° C. for 1 hour to allow the TMA to react with the terminal isocyanate group, thereby obtaining a solution of polyamide-imide resin 8 having a terminal carboxyl group. The carboxylic acid equivalent of the polyamide-imide resin 8 was measured by the potassium hydroxide titrimetric method.

The carboxylic acid equivalent of the polyamide-imide resin 3 obtained in Synthesis Example 3 was measured and found to be 140000.

Synthesis Example 9

The unmodified polyamide-imide resin obtained in the same manner as in Synthesis Example 8 was reacted with 2.4 g (12.5 mmol) of TMA to obtain a solution of polyamide-imide resin 9 having a terminal carboxyl group. The carboxylic acid equivalent of the polyamide-imide resin 9 was measured in the same manner as in Synthesis Example 8.

Synthesis Example 10

The unmodified polyamide-imide resin obtained in the same manner as in Synthesis Example 8 was reacted with 1.6 g (8.3 mmol) of TMA to obtain a solution of polyamide-imide resin 10 having a terminal carboxyl group. The carboxylic acid equivalent of the polyamide-imide resin 10 was measured in the same manner as in Synthesis Example 8.

Synthesis Example 11

The unmodified polyamide-imide resin obtained in the same manner as in Synthesis Example 8 was reacted with 0.16 g (0.83 mmol) of TMA to obtain a solution of polyamide-imide resin 11 having a terminal carboxyl group. The carboxylic acid equivalent of the polyamide-imide resin 11 was measured in the same manner as in Synthesis Example 8.

Synthesis Example 12

The unmodified polyamide-imide resin obtained in the same manner as in Synthesis Example 8 was reacted with 0.1 g (0.52 mmol) of TMA to obtain a solution of polyamide-imide resin 12 having a terminal carboxyl group. The carboxylic acid equivalent of the polyamide-imide resin 12 was measured in the same manner as in Synthesis Example 8.

Synthesis Example 13

4.0 g (37.0 mmol) of phenylene diamine was added to the solution of the unmodified polyamide-imide resin obtained in the same manner as in Synthesis Example 8 and the mixture was stirred with heating to 80° C. for 1 hour to allow the phenylene diamine to react with the terminal isocyanate group, whereby a solution of polyamide-imide resin 13 having a terminal amino group was obtained. The amine equivalent of the polyamide-imide resin 13 was measured by the hydrochloric acid titrimetric method.

Synthesis Example 14

0.8 g (7.4 mmol) of phenylene diamine was added to the solution of the unmodified polyamide-imide resin obtained in the same manner as in Synthesis Example 8, and reacted under the same conditions as in Synthesis Example 13 to obtain a solution of polyamide-imide resin 14 having a terminal amino group. The amine equivalent of the polyamide-imide resin 14 was measured in the same manner as in Synthesis Example 13.

Synthesis Example 15

0.1 g (0.9 mmol) of phenylene diamine was added to the solution of the unmodified polyamide-imide resin obtained in the same manner as in Synthesis Example 8, and reacted under the same conditions as in Synthesis Example 13 to obtain a solution of polyamide-imide resin 15 having a terminal amino group. The amine equivalent of the polyamide-imide resin 15 was measured in the same manner as in Synthesis Example 13.

Synthesis Example 16

0.8 g of p-aminophenol was added to the solution of the unmodified polyamide-imide resin obtained in the same manner as in Synthesis Example 8, and reacted under the same conditions as in Synthesis Example 13 to obtain a solution of polyamide-imide resin 16 having a terminal phenolic hydroxy group. The hydroxyl group equivalent (g/eq.) of the polyamide-imide resin 16 was measured by the acetyl chloride-potassium hydroxide method.

2. Preparation of Adhesive Varnish 25 g of an alicyclic epoxy resin (HP7200L, Dainippon Ink Chemical Industry Co., Ltd.) and 0.025 g of a catalyst (2E4MZ, Shikoku Chemicals Corporation) were added to 200 g of a solution of each polyamide-imide resin obtained above, and NMP was added thereto to adjust a solid content ratio to 35% by mass, whereby an adhesive varnish was obtained.

3. Production of Flexible Board Material

The adhesive varnish was applied to a polyimide film (Kapton (tradename), a 25 μm thickness, Toray DuPont) using an applicator. An adhesive layer was formed by drying at 150° C. using an oven to obtain an adhesive-applied polyimide film. Another Kapton of the same as above was adhered to the adhesive layer side, thermocompressed by heat pressing under conditions of 200° C., 4 MPa and 1 hour to obtain a flexible board material in which two polyimide films (Kapton) were adhered with each other through the adhesive layer.

Further, in place of the above Kapton, using a copper foil-applied resin film which has a copper foil laminated on one side of a polyimide film (MCF-5000I (tradename), a 25 μm thickness polyimide film, a 18 μm thickness copper foil, Hitachi Chemical Co., Ltd.), the adhesive varnish was applied to the polyimide film side in a thickness of 10 μm. Other than this, a flexible board material in which two copper foil-laminated polyimide films (MCF-5000I) were adhered with each other through the adhesive layer was obtained in the same manner as in the above.

3. Evaluation (Adhesion)

A test sample having a 1 cm width was cut out from the flexible board material. The one side of this test sample was immobilized, and the interface between the polyimide film and adhesive layer was separated under conditions of a peel angle of 90 degree and a peel rate of 50 mm/min, at which an average load was determined as an adhesion force. The flexible board material was evaluated for an adhesion force at ordinary state and after a humid absorption accelerated test (PCT test). The PCT test was carried out by allowing the test sample to stand for 3 hours under atmosphere of 121° C., 2 atmospheric pressures and RH 100%.

(Solder Heat Resistance)

A test sample of a 4 cm by a 4 cm square was cut out from the above flexible board material produced using MCF-5000I. After drying the test sample at 130° C. for 1 hour, the solder heat resistance was measured by the float process using a soldering bath at 288° C.

(Results)

The results are collectively shown in Tables 1 and 2. In Tables, the compositions (mol %) of the diamines used as ingredients for the synthesis of the polyamide-imide resins are also shown. Such compositions correspond to those of diimide dicarboxylic acid.

TABLE 1

| | | Polyamide-imide resin | | | | | | |
|---|---|---|---|---|---|---|---|---|
| | | 1 | 2 | 3 | 4 | 5 | 6 | 7 |
| Diamine | Polyoxy propylenediamine | 50 | 50 | 45 | 60 | 35 | 0 | 60 |
| | Siloxane diamine X-22-161A | 35 | 25 | 45 | 40 | 40 | 25 | 15 |
| | Aromatic amine BAPP | 0 | 25 | 0 | 0 | 25 | 40 | 25 |
| | Alicyclic diamine WHM | 15 | 0 | 10 | 0 | 0 | 35 | 0 |
| Adhesion force (Kapton) [kN/m] | Ordinary state | 1.3 | 0.9 | 1.2 | 1.5 | 0.9 | <0.1 | 0.8 |
| | PCT 3 hrs. | 1.3 | 0.9 | 1.3 | 1.5 | 0.4 | <0.1 | 0.8 |
| Adhesion force (MCF-5000I) [kN/m] | Ordinary state | 1.9 | 1.4 | 1.8 | 1.8 | 1.2 | <0.1 | 1.3 |
| | PCT 3 hrs. | 1.9 | 1.4 | 2.2 | 1.8 | 0.9 | <0.1 | 1.3 |
| Solder heat resistance 288° C. [sec.] | Ordinary state | 38 | 35 | 42 | 30 | 62 | — | 3 |

As shown in Table 1, when the polyamide-imide resins 1 to 4 having a polyoxy propylenediamine ratio of 40 mol % or more and a siloxane diamine ratio of 20 mol % or more were used, the adhesion force at ordinary state was obviously improved in comparison with the polyamide-imide resins 5 to 7, and the adhesion force was not impaired even after the humid absorption by PCT test. The polyamide-imide resin 7 having a siloxane diamine ratio of below 20 mol % maintained a good level of adhesion after the humid absorption, while the solder heat resistance was deteriorated.

TABLE 2

| | | Polyamide-imide resin | | | | | | | | | |
|---|---|---|---|---|---|---|---|---|---|---|---|
| | | 8 | 9 | 10 | 11 | 12 | 3 | 13 | 14 | 15 | 16 |
| Diamine | Polyoxy propylenediamine | 45 | 45 | 45 | 45 | 45 | 45 | 45 | 45 | 45 | 45 |
| | Siloxane X-22-161A | 45 | 45 | 45 | 45 | 45 | 45 | 45 | 45 | 45 | 45 |
| | Aromatic amine BAPP | 0 | 0 | 0 | 0 | 0 | 0 | 0 | 0 | 0 | 0 |
| | Alicyclic diamine WHM | 10 | 10 | 10 | 10 | 10 | 10 | 10 | 10 | 10 | 10 |

TABLE 2-continued

| | | Polyamide-imide resin | | | | | | | | | |
|---|---|---|---|---|---|---|---|---|---|---|---|
| | | 8 | 9 | 10 | 11 | 12 | 3 | 13 | 14 | 15 | 16 |
| Terminal group equivalent (g/eq.) | Carboxyl group | 2250 | 3500 | 5500 | 13500 | 22500 | 140000 | — | — | — | — |
| | Amino group | — | — | — | — | — | — | 2600 | 7000 | 24000 | — |
| | Hydroxyl group | — | — | — | — | — | — | — | — | — | 4250 |
| Adhesion force (Kapton) [kN/m] | Ordinary state | — | — | — | — | — | 1.2 | — | — | — | — |
| | PCT 3 hrs. | — | — | — | — | — | 1.3 | — | — | — | — |
| Adhesion force (MCF-5000I) [kN/m] | Ordinary state | 0.9 | 1.5 | 1.5 | 1.8 | 1.6 | 1.8 | 1.5 | 1.7 | 1.7 | 1.2 |
| | PCT 3 hrs. | 0.9 | 1.6 | 1.4 | 1.7 | 1.6 | 2.2 | 1.5 | 1.7 | 1.5 | 1.1 |
| Solder heat resistance 288° C. [sec.] | Ordinary state | >300 | >300 | >300 | >300 | 38 | 42 | 22 | 156 | 32 | 10 |

As shown in Table 2, when a carboxyl group, amino group or phenolic hydroxyl group was introduced at the terminal of the polyamide-imide resin, good adhesion force and heat resistance were also maintained. In particular, in the cases of the polyamide-imide resins 9 to 11 having a carboxyl group equivalent within the range from 3000 to 15000 g/eq. and the polyamide-imide resin 14 having an amine equivalent within the range from 3000 to 15000 g/eq., good adhesion force was maintained, while it was confirmed that the solder heat resistance was significantly enhanced.

The invention claimed is:

1. A polyamide-imide resin obtained by a process comprising the step of reacting a diimide dicarboxylic acid with an aromatic diisocyanate, and further reacting therewith a further compound selected from the group consisting of phthalic acid, trimellitic acid, maleic acid, biphthalic acid, naphthalene dicarboxylic acid, aminonaphthalene acid, aminobenzoic acid, diaminonaphthalene, diaminobenzoic acid, phenyldiamine and derivatives thereof,
wherein said diimide dicarboxylic acid contains 40 mol % or more of a compound represented by the following general formula (1),
20 mol % or more of a compound represented by the following general formula (2), and
a compound produced by the reaction of an alicyclic diamine and a trimellitic anhydride,

[Formula 1]

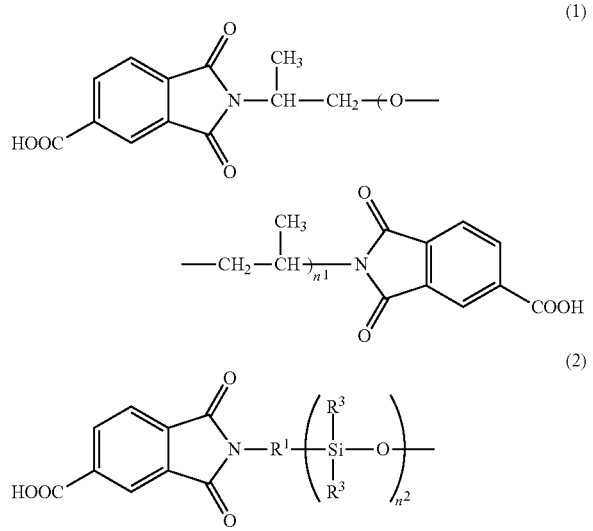

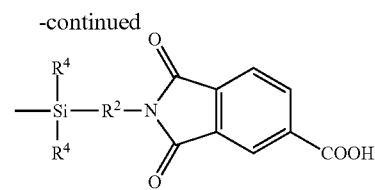

wherein $n^1$ is an integer of 1 to 100 in the formula (1), and $R^1$ and $R^2$ each independently represent a divalent organic group, $R^3$ and $R^4$ each independently represent a $C_{1-20}$ alkyl group or a $C_{6-18}$ aryl group, a plurality of $R^3$ and $R^4$ in the same molecule may be the same or different, and $n^2$ is an integer of 1 to 50 in the formula (2),
wherein the polyamide-imide resin has at least one terminal functional group selected from the group consisting of a carboxyl group and an amino group, and
wherein the polyamide-imide resin has a carboxylic acid equivalent of 3000 to 15000 g/eq or an amine equivalent of 3000 to 15000 g/eq.

2. The polyamide-imide resin according to claim 1 having a carboxylic acid equivalent of 3000 to 15000 g/eq.

3. The polyamide-imide resin according to claim 1 having an amine equivalent of 3000 to 15000 g/eq.

4. An adhesive containing an epoxy resin and the polyamide-imide resin according to claim 1.

5. The adhesive according to claim 4 which has, when an adhesive layer comprising said adhesive is formed on a polyimide film, an adhesion force of 1.0 kN/m or more at the interface between said polyimide film and said adhesive layer; maintains 90% or higher of a pre-test value of said adhesion force after a 3 hour PCT test; and has a solder heat resistance of 30 seconds or longer when measured by the float process using a soldering bath at 288° C.

6. The adhesive according to claim 4 which is provided on a polyimide.

7. A flexible board material provided with an adhesive layer formed of the adhesive according to claim 4.

8. A flexible laminate comprising a polyimide film, a metal foil provided on said polyimide film, and an adhesive layer adhering said polyimide film to another polyimide film or metal foil, wherein said adhesive layer is formed of the adhesive according to claim 4.

9. The flexible laminate according to claim 8 in which the metal foil is a copper foil.

10. A flexible printed wiring board comprising a polyimide film, a metal foil forming a wiring pattern and disposed on said polyimide film, and an adhesive layer adhering said polyimide film to another polyimide film or metal foil, wherein said adhesive layer is formed of the adhesive according to claim 4.

11. The adhesive according to claim 4 wherein the epoxy resin is a polyfunctional epoxy compound with at least two epoxy groups.

12. The adhesive according to claim 4 which includes 10 to 50 parts by mass epoxy resin per 100 parts by mass polyamide-imide resin.

13. The polyamide-imide resin according to claim 1 in which the diimide dicarboxylic acid contains 40 to 80 mol % of the compound represented by the general formula (1) and 20 to 60 mol % of the compound represented by the general formula (2).

14. The polyamide-imide resin according to claim 1, wherein said further compound is selected from the group consisting of phthalic acid, trimellitic acid, maleic acid, biphthalic acid, naphthalene dicarboxylic acid, aminonaphthalene acid, aminobenzoic acid, diaminonaphthalene, diaminobenzoic acid and phenyldiamine.

\* \* \* \* \*